(12) United States Patent
Bruning et al.

(10) Patent No.: US 6,225,811 B1
(45) Date of Patent: May 1, 2001

(54) WIRE DEGRADATION TESTING SYSTEM

(75) Inventors: Armin M. Bruning, Herndon; William G. Linzey, Alexandria, both of VA (US)

(73) Assignee: Lectromechanical Design Co., Sterling, VA (US)

( * ) Notice: Subject to any disclaimer, the term of this patent is extended or adjusted under 35 U.S.C. 154(b) by 0 days.

(21) Appl. No.: 09/281,214

(22) Filed: Mar. 30, 1999

Related U.S. Application Data

(60) Provisional application No. 60/079,799, filed on Mar. 30, 1998.

(51) Int. Cl.[7] .................................................. H04B 3/46
(52) U.S. Cl. ............................................ 324/544; 324/541
(58) Field of Search ................................ 324/544, 541, 324/539, 540, 134

(56) References Cited

U.S. PATENT DOCUMENTS

| | | |
|---|---|---|
| 464,125 | 12/1891 | Varley, Jr. et al. . |
| 1,565,613 * | 12/1925 | Anderegg ............................ 324/544 |
| 2,452,624 | 11/1948 | Zimmermann ..................... 175/183 |
| 2,460,107 | 1/1949 | Slade .................................. 175/183 |
| 2,526,891 | 10/1950 | Meyerhoff et al. ................ 175/183 |
| 2,595,246 | 5/1952 | Grant, Jr. et al. .................. 177/329 |
| 2,794,170 | 5/1957 | Gooding ............................. 324/54 |
| 2,942,181 | 6/1960 | Edwards et al. ................... 324/54 |
| 3,047,800 | 7/1962 | Eigen .................................. 324/54 |
| 3,346,809 | 10/1967 | Bader et al. ........................ 324/54 |
| 3,349,324 | 10/1967 | Wakefield .......................... 324/54 |
| 3,374,428 | 3/1968 | Eager, Jr. et al. .................. 324/54 |
| 3,504,395 | 4/1970 | MacPherson ........................ 18/2 |
| 3,530,045 | 9/1970 | Alburger ............................. 204/1 |
| 3,612,994 | 10/1971 | Hooper ............................... 324/54 |
| 3,820,011 | 6/1974 | Hoveman ........................... 324/54 |
| 3,866,117 | 2/1975 | Erdman .............................. 324/54 |
| 4,160,947 | 7/1979 | Tanno et al. ....................... 324/54 |
| 4,240,026 * | 12/1980 | Murphy et al. .................. 324/514 |
| 4,510,435 | 4/1985 | Tanno ................................ 324/52 |
| 4,517,510 | 5/1985 | Clinton .............................. 324/52 |
| 4,891,597 | 1/1990 | Asars ................................ 324/557 |
| 4,929,903 | 5/1990 | Saigo et al. ..................... 324/544 |
| 4,980,645 | 12/1990 | Soma et al. ..................... 324/541 |
| 5,050,093 | 9/1991 | Reddy et al. ..................... 364/507 |
| 5,067,343 | 11/1991 | Sullivan ............................ 73/40.7 |
| 5,128,620 | 7/1992 | McArdle .......................... 324/544 |
| 5,206,597 | 4/1993 | Rivera et al. .................... 324/664 |
| 5,448,176 * | 9/1995 | Mashikian ....................... 324/551 |
| 5,477,152 * | 12/1995 | Hayhurst ......................... 324/542 |
| 5,760,590 | 6/1998 | Striffler .......................... 324/514 |

* cited by examiner

Primary Examiner—Ernest Karlsen
Assistant Examiner—Anjan K Deb
(74) Attorney, Agent, or Firm—Sughrue, Mion, Zinn, Macpeak & Seas, PLLC

(57) ABSTRACT

A part of a wire is tested, in situ, for degradation. The part of the wire is optionally enclosed in a jacket. A conductive medium is disposed on the wire. A test unit has a test elements in contact with the conductor of the wire and with the conductive medium. An attempt is made to induce a current along a path from the test unit, through the conductor, through the conductive medium, and back to the test unit. If a current is induced, degradation is detected. The test unit receives a cable of wires, and a selector switch of the test unit electrically couples a voltage source to selected elements of the cable in turn. Wires are tested in situ in an aircraft or other restrictive location.

15 Claims, 18 Drawing Sheets

WIRE DEGRADATION TESTING SYSTEM

CROSS REFERENCE TO RELATED APPLICATIONS

This application is an application filed under 35 U.S.C. §111(a) claiming benefit pursuant to 35 U.S.C. §119(e)(1) of the filing date of the Provisional Application 60/079,799 filed on Mar. 30, 1998 pursuant to 35 U.S.C. §111(b). The Provisional Application 60/079,799 is incorporated by reference in its entirety.

BACKGROUND OF THE INVENTION

Weight is an important factor in aircraft design. Using lighter components is one way of reducing weight in an aircraft.

Wiring is an important component in every aircraft, and contributes significantly to the weight of an aircraft. In this context, a wire may be understood to include a conductor provided with a protective outer layer referred to as insulation. Furthermore, the term "wiring" as used herein may be understood to include conductive wires that carry signals, current, and the like. The term "testing" of wiring as used herein may be understood to include testing various qualities of the conductor, the insulation, or both.

Wires may be bundled together and enclosed with a common shield made of various materials such as nylon, rubber, and the like. On the other hand, it is frequently the case that a bundle of wires is not enclosed with a common shield. In either case, however, such a bundle of wires may be referred to as a cable. Other common terms for a cable are a harness or a loom.

There are various approaches to making the wiring in an aircraft design weigh less. One approach is to reduce the length of wire as much as possible. Another approach is to use the smallest conductor that is considered to be safe for the load. Yet another approach is to equip the wiring with a lightweight insulation.

Although the use of lightweight insulation is a prominent approach to reducing the overall weight of the wiring component in an aircraft design, this approach includes risks not heretofore appreciated. One such risk is the risk of degradation of the insulation. Degradation may result from vibration, chafing, or impact. Degradation may result from the simple aging of the insulation and from the exposure of the insulation to harmful environments. As used here, degradation means damage to insulation from any source whatever.

The insulation is an important part of the wiring because it keeps conductors of different wires from undesirably coming into contact with each other and from undesirably coming into contact with an electrical ground. When different wires undesirably come into contact with each other, short circuits can occur. Insulation also keeps the conductor of a wire from undesirably coming into contact with the environment surrounding the wire. When the conductor of a wire undesirably comes into contact with its surrounding environment, sparks, fires, and explosions can result. Another possible result of such an undesirable contact is the malfunction of the connected or nearby equipment, or the propagation of invalid data or unwanted noise.

This invention relates to the testing of wires for degradation. The degradation tested is primarily degradation of the insulation. Even more particularly, this invention relates to the testing of wiring in situ, or in its normal place of operation. This invention was developed in the particular context of aircraft wiring, and the examples described herein are given in that context. Nevertheless, the invention is extremely useful for testing wires for degradation in situ in any setting. In particular, it is envisioned that the invention may be used with wiring installed in such settings as the home, in ships, underground, in buildings, or the like.

There are certain problems with the testing of in-place wiring insulation.

First of all, a cable may contain numerous wires, each with its own insulation that needs to be tested.

A second problem is that the wires to be tested may be inaccessible except at the ends. In an aircraft, or in an underground wiring system, cables containing wires may extend for hundreds of yards, or even miles, without the opportunity for access. Ideally, a test that identifies wiring degradation should take inaccessibility into account. Moreover, it is very often the case that only one of the two ends is available or accessible. Where only one end is accessible, a loop-back type of test is substantially impossible. A test that accounts for single-end accessibility is required.

A third problem with testing wires for degradation is that some testing methods may actually cause damage to the insulation, or to the conductor, or to the connected equipment. For example, testing a wire using high voltage may damage equipment connected to the other end of the wire, or may even further injure degraded insulation.

The following patents are representative of the art, and each is incorporated by reference in its entirety for its useful background information: U.S. Pat. Nos. 464,125; 2,526,891; 2,942,181; 3,349,324; 3,820,011; and 4,891,597.

In U.S. Pat. No. 464,125, there is disclosed a technique for testing insulated wires. In particular, a bundle of insulated wire is immersed in a tank of water. An electromotive force is provided at one end of the wire at the conductor of the wire. A conductor is placed in the water. The insulation on the wire is determined to be defective if a current can be induced to flow from the one end of the wire connected to the electromotive force, through the insulation, and to the conductor that is in the tank of water.

This method and apparatus for testing wire insulation is unsuitable for use in aircraft or the like because it requires the complete removal of the wire or cable, and its immersion in a big vat of water. Big vats of water cannot reasonably be used in an aircraft or the like in view of the risk of harmful effects to the surrounding environment. Another reason that big vats of water cannot reasonably be used for in situ testing is that wires are often affixed to elevated parts of the interior structure, and it is very hard to remove the wire far enough from the interior so as to submerge it in such a vat.

In U.S. Pat. No. 2,526,891, there is disclosed a method of testing electrical conductors. According to this method, a twisted pair of wires is tested by applying a DC polarizing potential across the two wires for a period of time sufficient to create electrolytic polarization in the moisture of the sheaths, disconnecting the source of polarizing potential from the wires, and measuring the electrolytic polarization potential residual in the moisture after disconnection of the polarizing potential.

According to this approach, the wire must be a twisted pair of copper wires each sheathed with a seamless sheath of paper pulp. It is assumed that the paper pulp sheaths already contain as much as 15 percent water weight, either residual from the making of the sheaths or outdoor from the atmosphere during storage. The teachings of this patent relate to the manufacturing stage of wire and, more particularly, to the detection of breaks in a wire when the amount of moisture in the paper pulp sheaths is enough to cause a false reading that the conductor is not broken. No conductive medium is applied to the wires, and there must be at least two breaks in the insulation for a detection to be made.

U.S. Pat. No. 2,942,181 describes an apparatus for testing cables. This cable-testing apparatus tests a cable as it is wound from one reel to another reel. As the cable moves between the two reels, it is immersed in a tank of water. One end of the cable is connected to an electromotive force. Submerged in the tank of water is. an electrode. If the electromotive force can cause a current to flow from one end of the cable through a crack in the insulation and to the electrode submerged in the water, then a defect in the cable is detected.

This approach is unsuitable for use where the wires to be tested cannot be removed and dipped in the tank of water. Furthermore, this United States patent does not contain any teaching or suggestion relating to how much electromotive force should be used in the attempt to cause a current to flow to the submerged electrode. In addition, in the foregoing approach assumes that there is no sensitive or delicate equipment connected to the cable.

U.S. Pat. No. 3,349,324 describes an apparatus for locating faults in insulated electric cables. The apparatus has an elongated tube that contains a conducting liquid electrode. According to this approach, a cable is transferred from one reel to another. During the transfer, the cable passes through a tube filled with water. The tube is pressurized. The tube itself is made of an electrical conducting material. Under this approach, an electromotive force is applied to the tube itself, while one end of the cable is grounded.

With the foregoing approach, it is necessary that the entire tube be insulated from the ground. Also, it is assumed that the cable is completely disconnected from any sensitive or delicate equipment, and also that the cable is not installed, but is passed from one reel to another. This method is therefore entirely unsuitable for use in an in situ test.

U.S. Pat. No. 3,820,011 provides for a trough into which a wire is submerged so that faults in the insulation around the wire can be detected. The testing described in this document describes the use of low voltage in the detection of faults. Under this approach, however, it is assumed that the wire is fed through the trough. Thus, the wire must be in a state in which it is not installed in a restrictive area, such as an aircraft or the like.

U.S. Pat. No. 5,206,597 describes a capacitive moisture detection apparatus. In particular, the apparatus is meant to measure the volume of water intrusion in underwater cables without having to take the cables apart. According to this method, a cable is fed from one reel to another through an elongated tube. In the elongated tube, which is a cylindrical brass shell, there are two curved electrical conducting plates which serve as capacitance plates. The volume of water that has infiltrated the cable is determined by measuring the capacitance.

None of these patents provides for an acceptable in situ testing of a wire for degradation, and none provides for any protection of the equipment that remains connected to the cable during the test.

Furthermore, in situ testing of a wire in an aircraft or the like often involves wires that are suspended overhead or are affixed or attached to walls of the aircraft.

SUMMARY OF THE INVENTION

It is an object of this invention to provide a wire degradation testing method for in-place wiring in situ. It is also an object of this invention to provide a wire degradation testing method for testing wire in situ that solves the above-identified problems.

To achieve the foregoing objects and advantages of the invention, there is provided a method of testing a part of a wire for degradation. A conductive medium is disposed on the wire or wires. As used here, a conductive medium is a substance which, in liquid form, conducts electricity. This method may include a step of enclosing the part of the wire to be tested in a jacket. An end of the wire to be tested is electrically coupled to a test device. The conductive medium is electrically led out and also coupled to the test device. An electromotive force is introduced into the wire. If it is detected that current meeting various criteria is flowing through the wire, through the conductive medium, and to the test device, it is determined that there may be a fault with the insulation. The conductive medium is preferably controlled during the testing to ensure no damage to the surrounding environment.

The foregoing objects of the invention are also realized by way of an apparatus for testing wire in situ. The apparatus may include a jacket for holding the conductive medium, test elements connected to the wire and the conductive medium, and a test unit coupled between a test elements. In a preferred embodiment, the test unit includes an adapter that makes it possible to test all the wires of a cable in a convenient manner. In particular, the test unit has a cable receptor and a switch that permits the operator to connect the test unit to each of the wires in the cable in turn.

The foregoing objects of the invention are also realized by way of various creative methods for testing wire in situ by disposing a conductive medium on the wire and, without the use of a jacket, still controlling the conductive medium so that the surrounding environment is protected from damage, even when the wire is in an awkward position in an airplane.

BRIEF DESCRIPTION OF THE DRAWINGS

The above objectives and the advantages of the present invention will become more apparent from the following description, in detail, of a presently preferred embodiment of the invention read with reference to the attached drawings.

DETAILED DESCRIPTION OF THE PREFERRED EMBODIMENTS

One embodiment of the invention is provided in the DelTest™ system, available from Lectromechanical Design Company™, 45000 Underwood Lane, Unit L, Sterling, Va. 20166-9557. DelTest™, Lectromechanical Design Company™, and LectroMec™ are trademarks of Lectromechanical Design Company.

Figure 1:
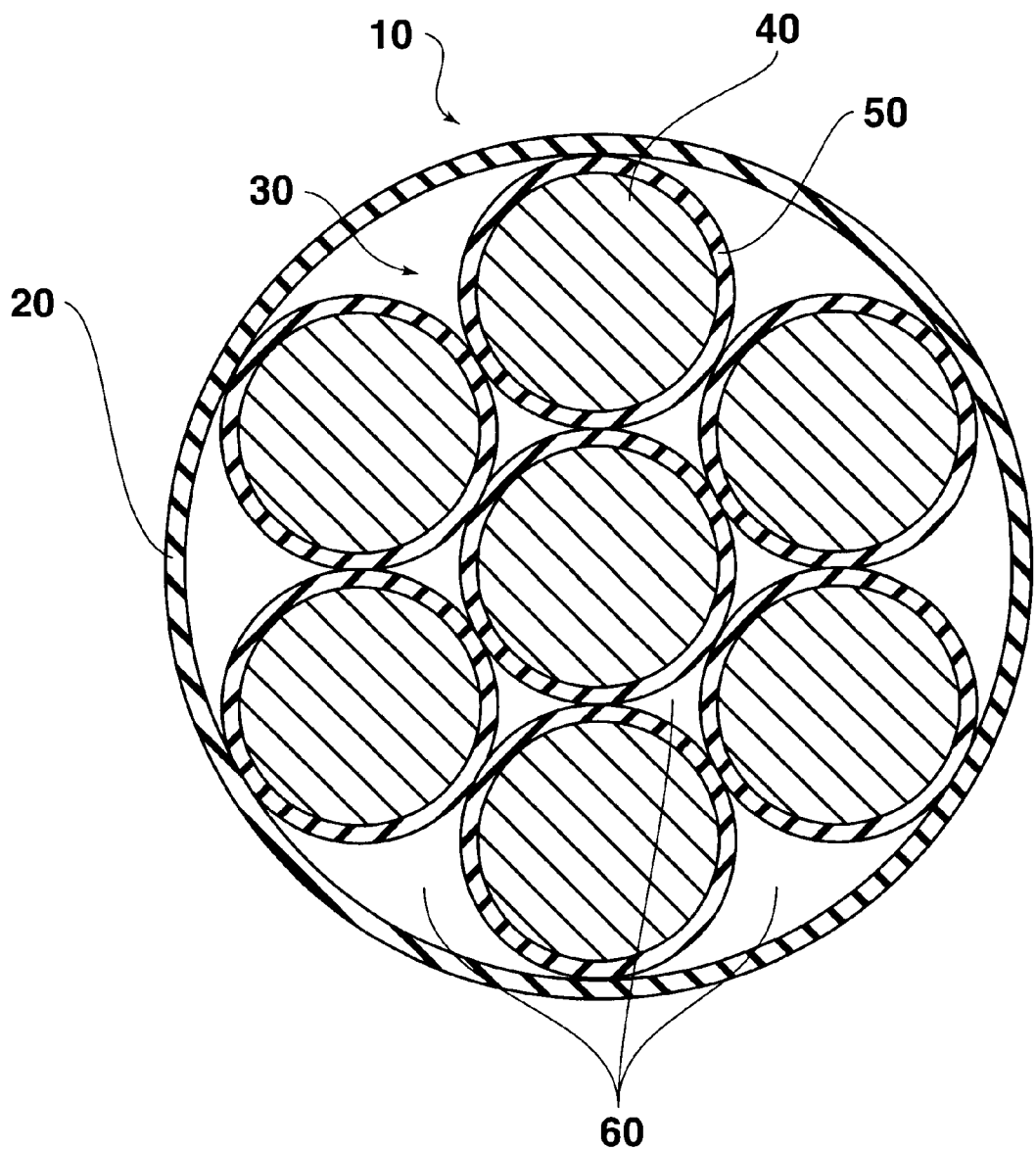
FIG. 1 is a sectional view of a cable.

FIG. 1 shows a cable, indicated in general by reference numeral 10. The cable shown includes a cable shield or covering 20. The covering 20 may include multiple layers and a protective mesh (not shown). Although FIG. 1 shows a cable with a cable shield, it is typically the case that the cable has no shield at all, and sometimes has only a lacing to hold it in place. Inside the cable 10 there is at least one wire, indicated generally by reference numeral 30. In FIG. 1, seven wires 30 are shown, although a cable may contain an arbitrary number of wires. Each wire 30 includes a conductive part 40. The conductive part 40 will be referred to hereafter as a conductor, even though the conductive part 40 may include many smaller individual conductors. Each wire 30 also includes insulation 50. The insulation 50 insulates the conductor 40. Inside the cable 10 there may be interstitial spaces 60 between the wires. The spaces 60 typically contain air.

Figure 2:
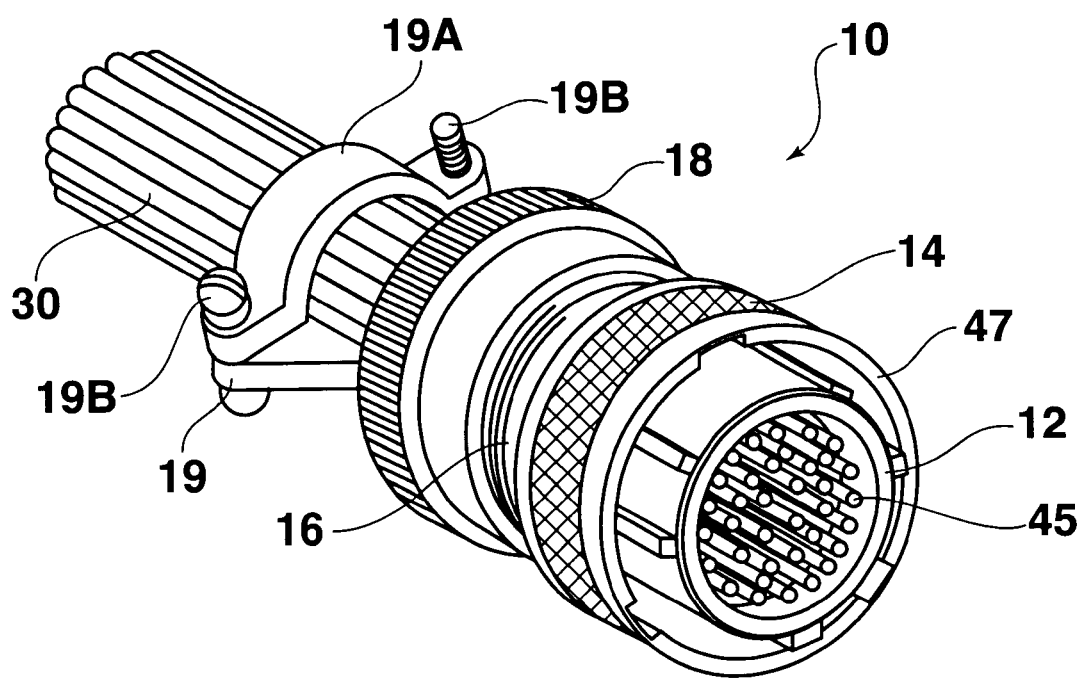
FIG. 2 is a perspective view of a cable connector.

FIG. 2 shows another cable 10 and, in particular, the details of the end of a cable which may be used in an aircraft. The cable covering 20 is not shown and, indeed, it may not be present in some cables. The cable 10 includes a plurality of wires 30. The conductor 40 of each wire 30 is electrically connected to a respective pin 45. It should be appreciated that, instead of respective pins 45, a cable might just as well have sockets instead. The pins 45 are normally in a one-to-one correspondence with the conductors 40. The pins 45 may be protected and rigidly held by an outer metal housing 12 which may be provided with a rotatable locking ring 14. The rear portion of the housing 12 may be an externally threaded rear portion 16 adapted to receive an internally threaded backshell member 18. The backshell 18 may have integrally formed with it a part of a strain relief 19. A strain relief clamp portion 19A may be provided to cooperate with strain relief 19 so as to secure wires 30. Threaded fasteners 19B may be provided to fasten the strain relief clamp 19A to the strain relief 19 of the backshell 18. The outer circumference of the housing 12 may be provided with raised areas 47 that act as keys for precisely aligning the end of the cable 10 with corresponding recesses in the inner circumference of a mating connector.

Figure 3:
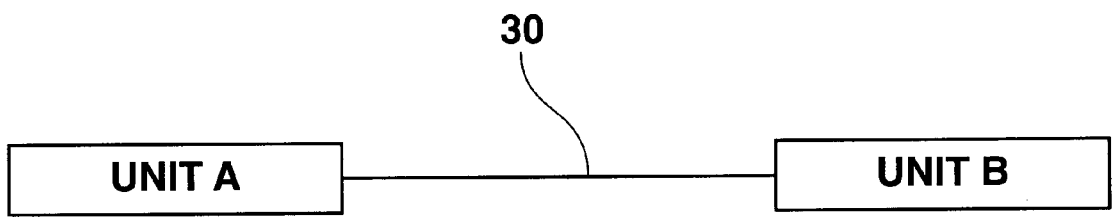
FIG. 3 shows a wire connecting two pieces of equipment.

FIG. 3 shows, in a simplified schematic form, a wire 30 connecting Unit A and Unit B. The wire 30 has a conductor 40 surrounded by insulation 50. Of course, it will be appreciated that the wire may be a bundle of wires, may be several lengths of wire connected together at intervening connectors (not shown), and that certain ones of the bundle of wires may extend from some equipment other than Unit A or may connect to some equipment other than Unit B.

Figure 4:
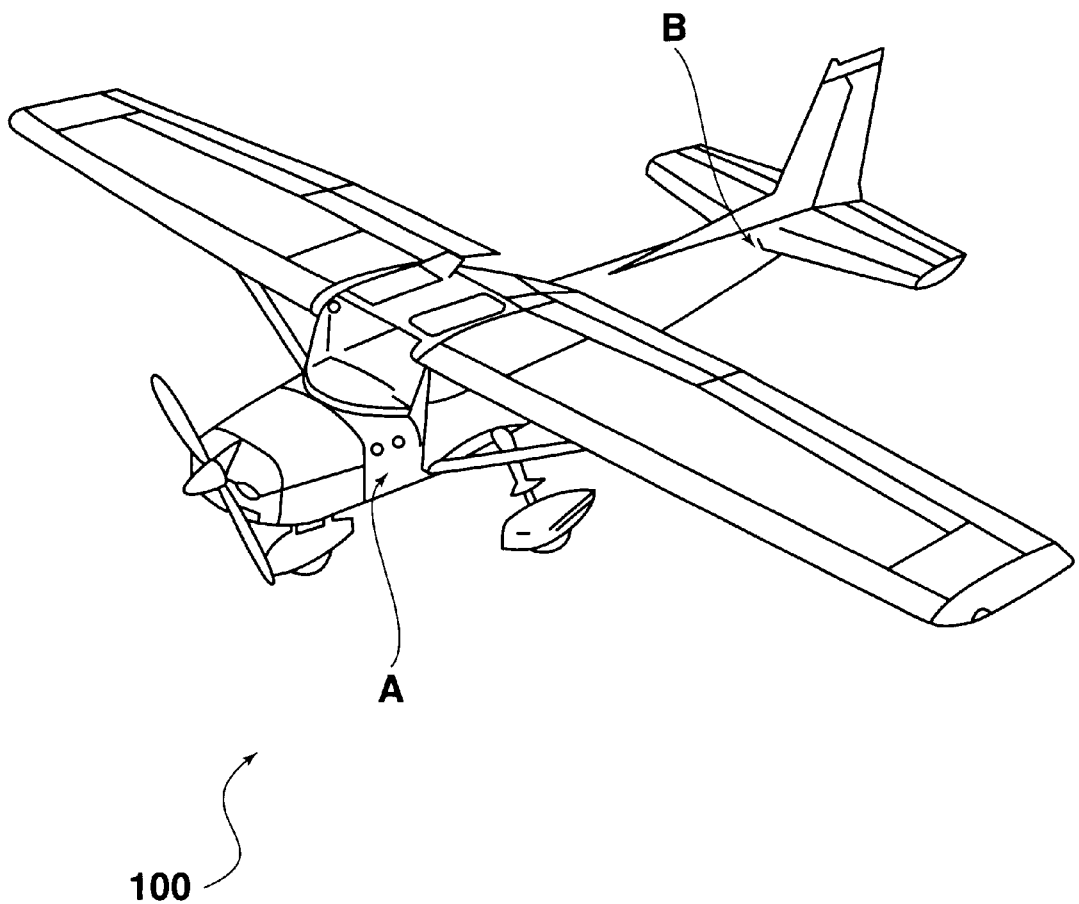
FIG. 4 shows the approximate location of these two pieces of equipment in an airplane.

FIG. 4 shows an aircraft 100, and the approximate locations of Unit A (A) and Unit B (B). Aircraft 100 is an example of a situation in which removing wire 30 for testing is impractical.

Figure 5:
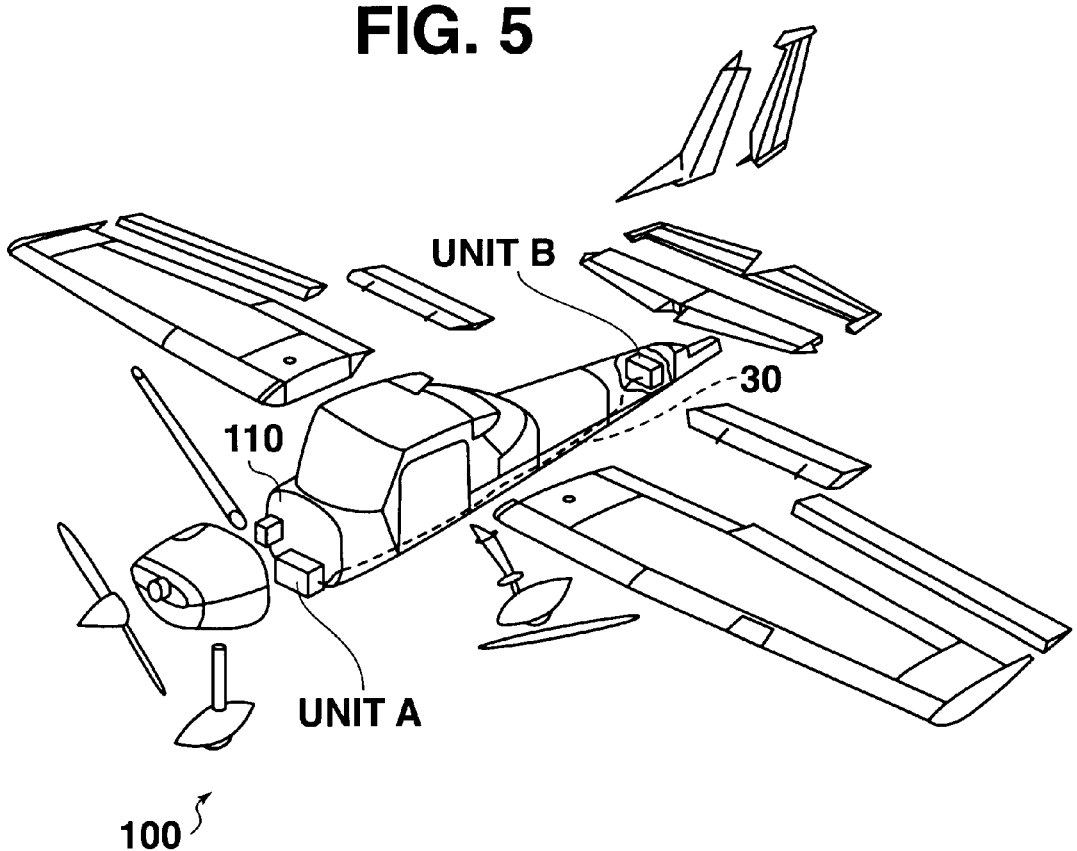
FIG. 5 shows an exploded view of the airplane, and shows the two pieces of equipment connected by a wire.

FIG. 5 shows an exploded view of the aircraft 100, revealing Units A and B, and the wire 30 connecting the units. Wire 30 passes through bulkhead 110 of the aircraft 100.

Figure 6:
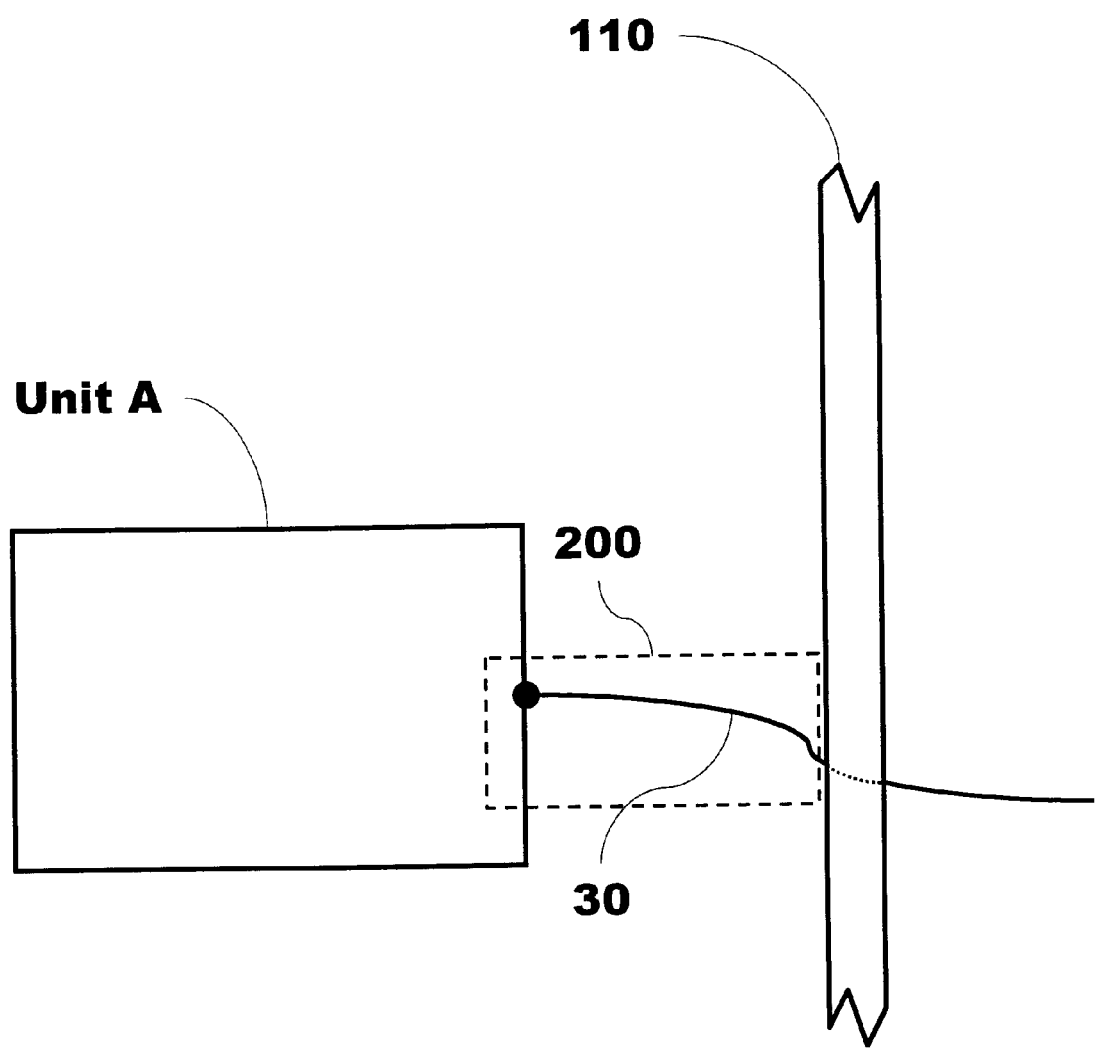
FIG. 6 shows the two pieces of equipment and part of the wire in a simplified schematic representation.

FIG. 6 depicts Unit A and bulkhead 110. Wire 30 is shown connected to Unit A, and extending toward Unit B after passing through bulkhead 110. Bulkhead 110 represents a point at which the wire is substantially inaccessible. This point of inaccessibility may exist because of a physical obstacle, such as bulkhead 110, or may exist because access to the wire beyond the point of inaccessibility is merely inconvenient. For the remainder of this discussion, reference numeral will be referred to, in the main, as the point of inaccessibility or, for linguistic convenience, as point 110. It will be appreciated that point 110 may, in other settings, not relate at all to a bulkhead. For example, where an underground wire is concerned, point 110 may be where the wire enters an enclosed conduit. Where a dwelling is concerned, point 110 may be where the wire enters behind a dwelling wall or into an attic.

The inventors have discovered that degradation of the wire 30 may occur at the part of the wire between the point of inaccessibility and the equipment to which the wire is connected. In FIG. 6, this area is shown by reference numeral 200. This area may be referred to as a high degradation area. This high-degradation area 200 may be subject to much more wear and tear than many other parts of the wire 30. Since an important amount of the degradation of the wire 30 may occur in high-degradation area 200, it is possible to detect much of the degradation by testing only this part of the wire. For linguistic convenience, this high-degradation area 200 will be referred to as the end 200 of the wire 30. It will be appreciated, however, that this usage of the term "end" means more than just the end of the wire, in the normal sense, but includes the part of the wire between the equipment (Unit A, for example) and the point of inaccessibility 110.

It will be appreciated, however, that the degradation of wire can occur anywhere along the length of the cable. The degradation of wire is often associated with locations in which the wire is exposed and, thus, more vulnerable to damage. Similarly, the degradation of wire may occur in situations in which the wire is improperly installed. For example, when a wire is improperly installed in an airplane, it may be subjected to excessive vibration or rubbing. Wire may be secured in place improperly, thus subjecting the insulation to damage by the device that secures the wire in place.

For the sake of explanation, the focus of the following description will be on degradation that occurs at the end of the wire, but it will be appreciated that the explanation and techniques described herein may apply along the entire length of the wire. Furthermore, the description will be targeted to detecting degradation using a jacket. Afterward, the discussion will reach ways to test for degradation without a jacket. Also, as a preliminary matter, the term, "conductive medium" will be defined for the purposes of this disclosure.

A conductive medium is a substance which, in liquid form, is electrically conductive. Normal water is an excellent example of a conductive medium, and is used as an example throughout this discussion. Water is advantageous as a conductive medium in that it is plentiful, safe, relatively easy to work with, and, typically, sufficiently conductive. Distilled water, of course, lacks any minerals and does not constitute an effective conductive medium. Water evaporates so that, if some remains on the wiring being tested after the test, it will rapidly disappear without further human intervention.

Water, of course, may be used as a solvent to dissolve a solute, like salt, to form a more conductive medium than regular water. Salt water is thus an example of a conductive medium. Salt water has excellent conduction of electric current. An advantage of salt water is that, when it dries, all that typically remains is dried salt. Dried salt is not an effective conductor, and may be said to have important insulative properties.

Substances like salt water, which are conductive in liquid form and yet dry, leaving behind a substantially non-conductive substance, are preferred for use as a conductive medium. As used herein, for the remainder of the discussion, and unless otherwise specified, water means water which is not just distilled water and which may contain some salt or other minerals.

Another example of a substance which may be useful as a conductive medium is an ionized noble gas, such as Argon.

Figure 7:
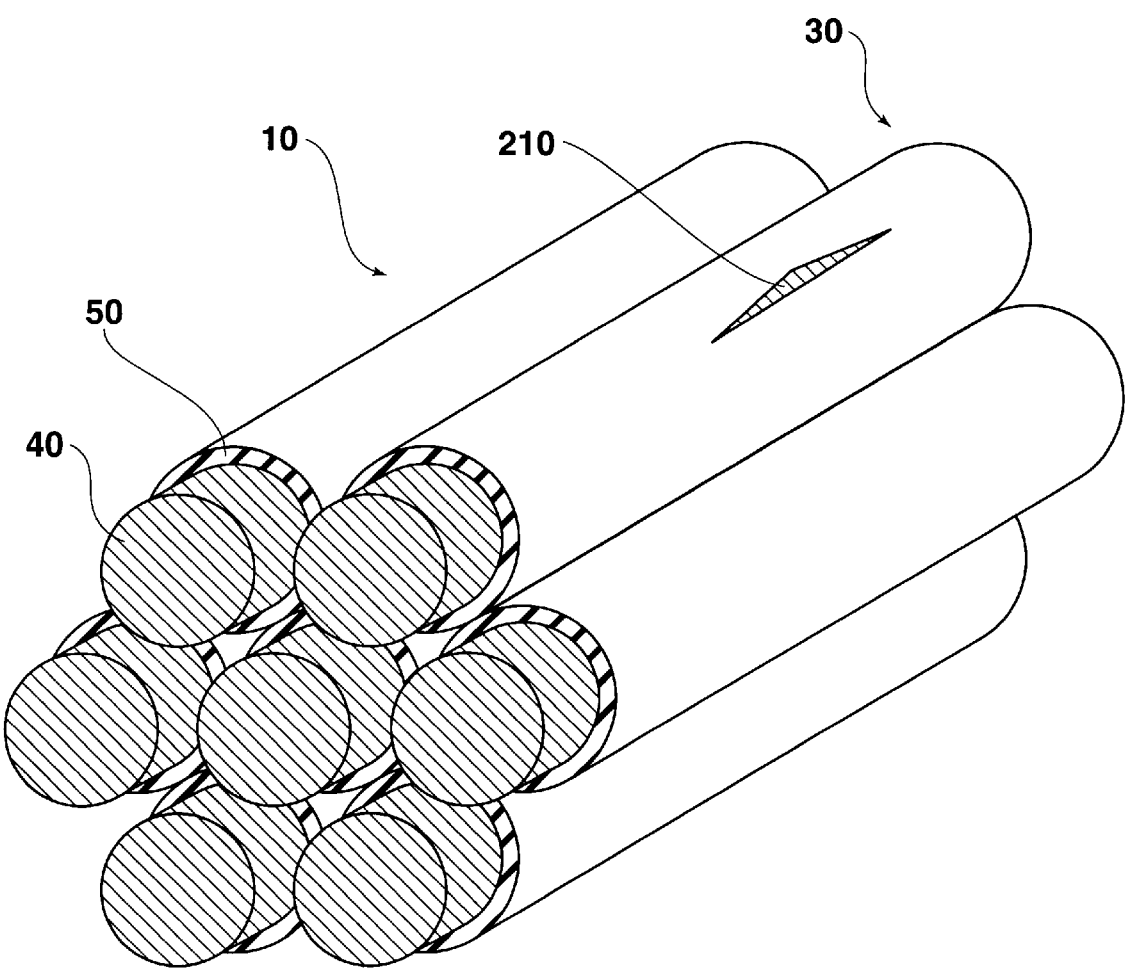
FIG. 7 shows a perspective view of the wires of a cable, with one of the wires having a degradation in its insulation.

FIG. 7 depicts a cable 10 in which one of the wires 30 includes an area of degraded insulation 210. Although the degradation 210 is shown as a large, visible break in the insulation, the degradation of insulation might not be manifested in such a manner. The degradation of insulation can appear as cracks visible only under magnification. These micro-cracks are large enough, however, to present a potentially serious problem.

Figure 8:
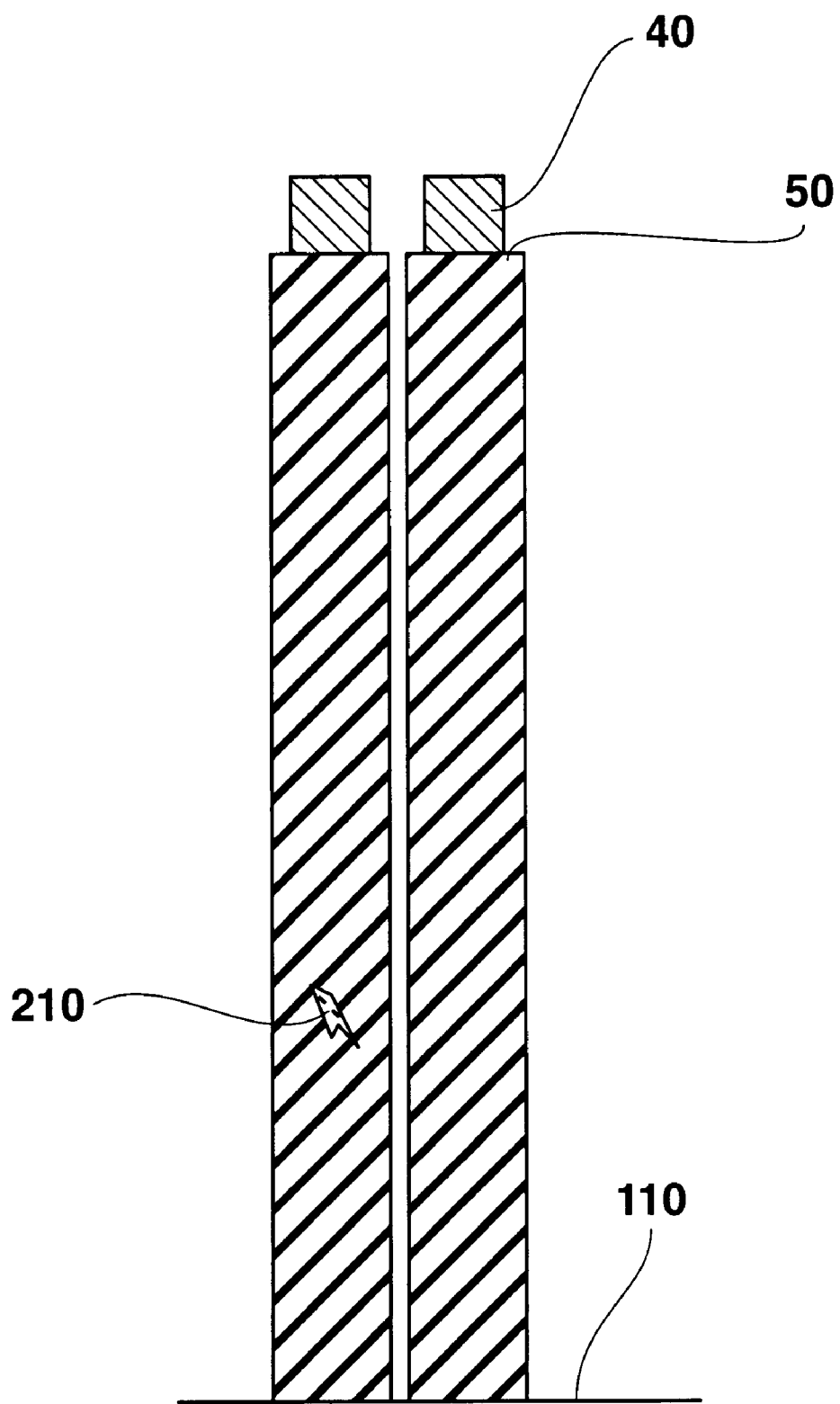
FIG. 8 shows a simplified schematic representation of two wires and a degradation in the insulation of one of the two wires.

FIG. 8 shows only two of the wires 30 that were depicted in FIG. 7. Also shown is crack 210, which is representative of the different kinds of degradations that can occur in a wire.

Figure 9:
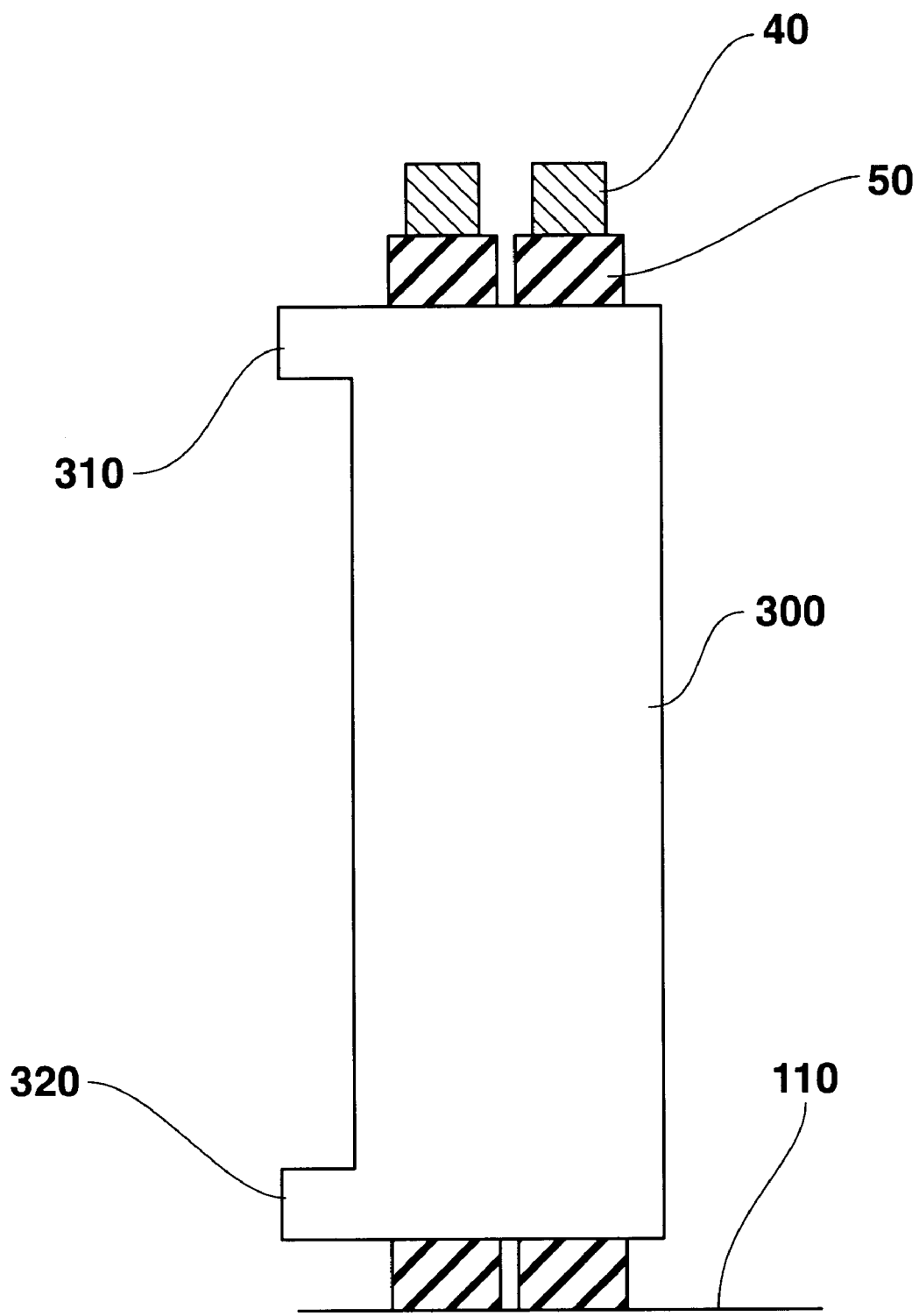
FIG. 9 shows a simplified schematic representation of the same two wires enclosed by a jacket.

FIG. 9 shows the same two wires that were shown in FIG. 8, but also shows at jacket 300. Jacket 300 includes an introduction port 310 and an evacuation port 320. Introduction port 310 is for introducing into the jacket a conductive medium, such as water. The evacuation port 320 is for removing the conductive medium from the jacket.

Figure 10:
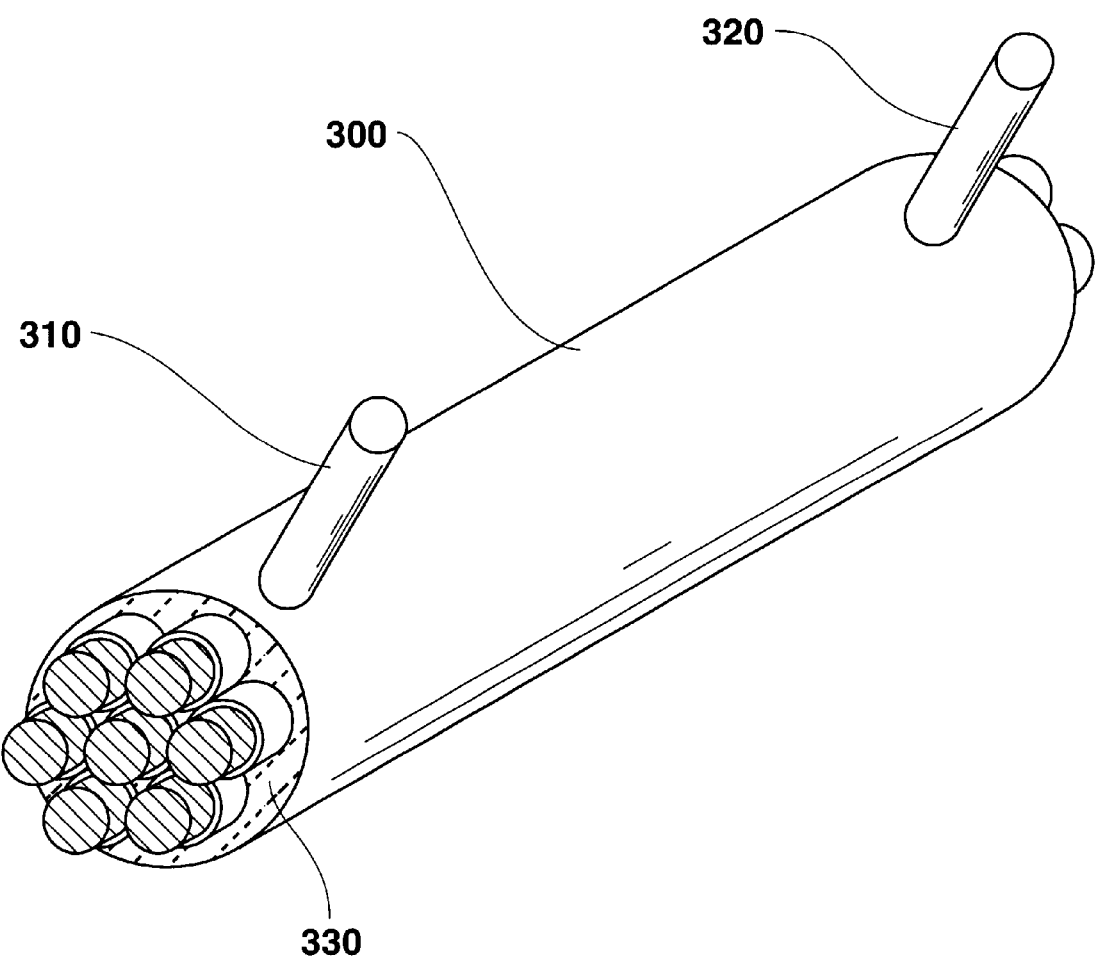
FIG. 10 shows a perspective view of the wires of the cable enclosed, in part, by a jacket.

FIG. 10 shows a perspective view of jacket 300, introduction port 310, and evacuation port 320. FIG. 10 also shows one of the two ends 330 of the jacket 300. As a practical matter, the jacket may be constructed in a wide variety of ways. For example, the jacket may include a tube through which the part of the wire to be tested is inserted. Similarly, the jacket may include a tube which may be opened along an edge so that the tube may be positioned around the part of the wire to be tested. Another way to produce jacket 300 is to fabricate it from tape used as a wrap. In particular, latex rubber tape, silicon rubber tape, or self-bonding polymer tapes, all commercially available, may be used as a wrap to form a substantially watertight jacket.

In particular, the part of the wire to be tested is wrapped using overlapping turns, and the introduction and evacuation ports are positioned so as to communicate with the inside of the tube formed by the plastic wrap. Then, more tape may be used to make the jacket have a substantially watertight seal around the ports, at the two jacket ends 330, and all up and down the length of the jacket. One important goal in making the jacket is that the jacket hold, without much leaking, the conductive medium. A small amount of leaking is acceptable, provided that the leaking conductive medium can be absorbed or captured before it has the chance to cause any damage to the surrounding area. Of course, it is wise also to cover sensitive equipment.

The manner in which a substantially watertight seal is provided at each of the two ends 330 of the jacket 300 is not the subject of this invention, and various ways to achieving such a seal will occur to those familiar with this field of endeavor. For example, simply wrapping tape tightly around the end of the jacket several times, and being sure to overlap the wire or cable, may provide a sufficient seal to keep the conductive medium in the jacket 300 without much leaking. Of course, the jacket ends 330 could be caulked. If a jacket 300 is produced with a particular cable in mind, the jacket can be custom-made with an appropriate rubber seal at each of the jacket ends 330 to fit closely around the wires in the cable.

Figure 11:
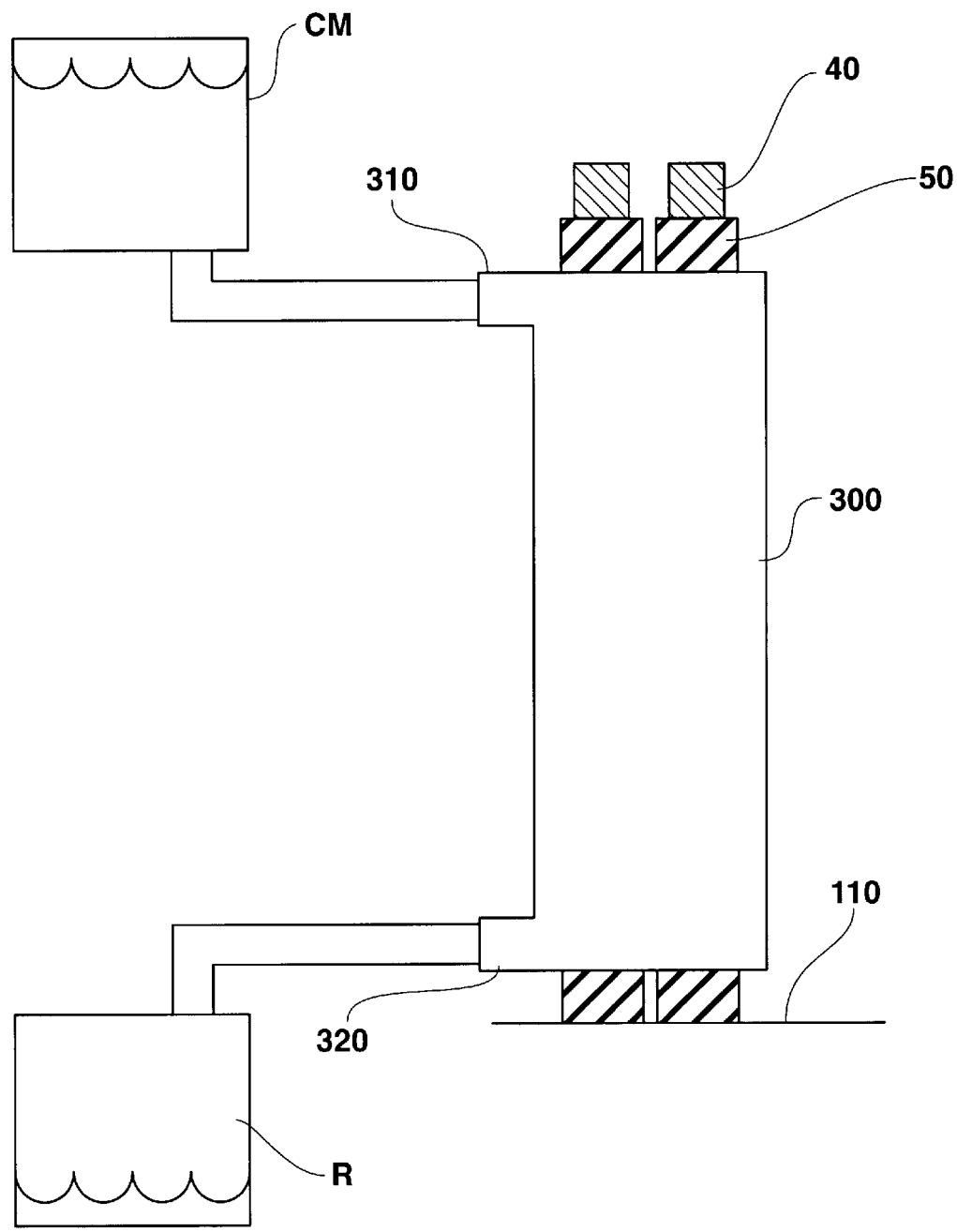
FIG. 11 shows a simplified schematic representation of how conductive medium is introduced into the jacket, and how it is evacuated.

FIG. 11 shows a container for introducing the conductive medium CM, and a reservoir R for receiving evacuated conductive medium. The conductive medium is caused to enter the introduction port 310 from the container CM by virtue of and inducing force, which may be air pressure, gravity feed, or the like. The conductive medium fills up the space in jacket 300, and, at the desired time, may be evacuated from evacuation port 320 into reservoir R by virtue of another force, which may be a vacuum or the like. Valves may be placed at the introduction port 310 and the evacuation port 320. Without such valves, it may be necessary to provide a constant flow of conductive medium from container CM through jacket 300 to reservoir R.

Figure 12:
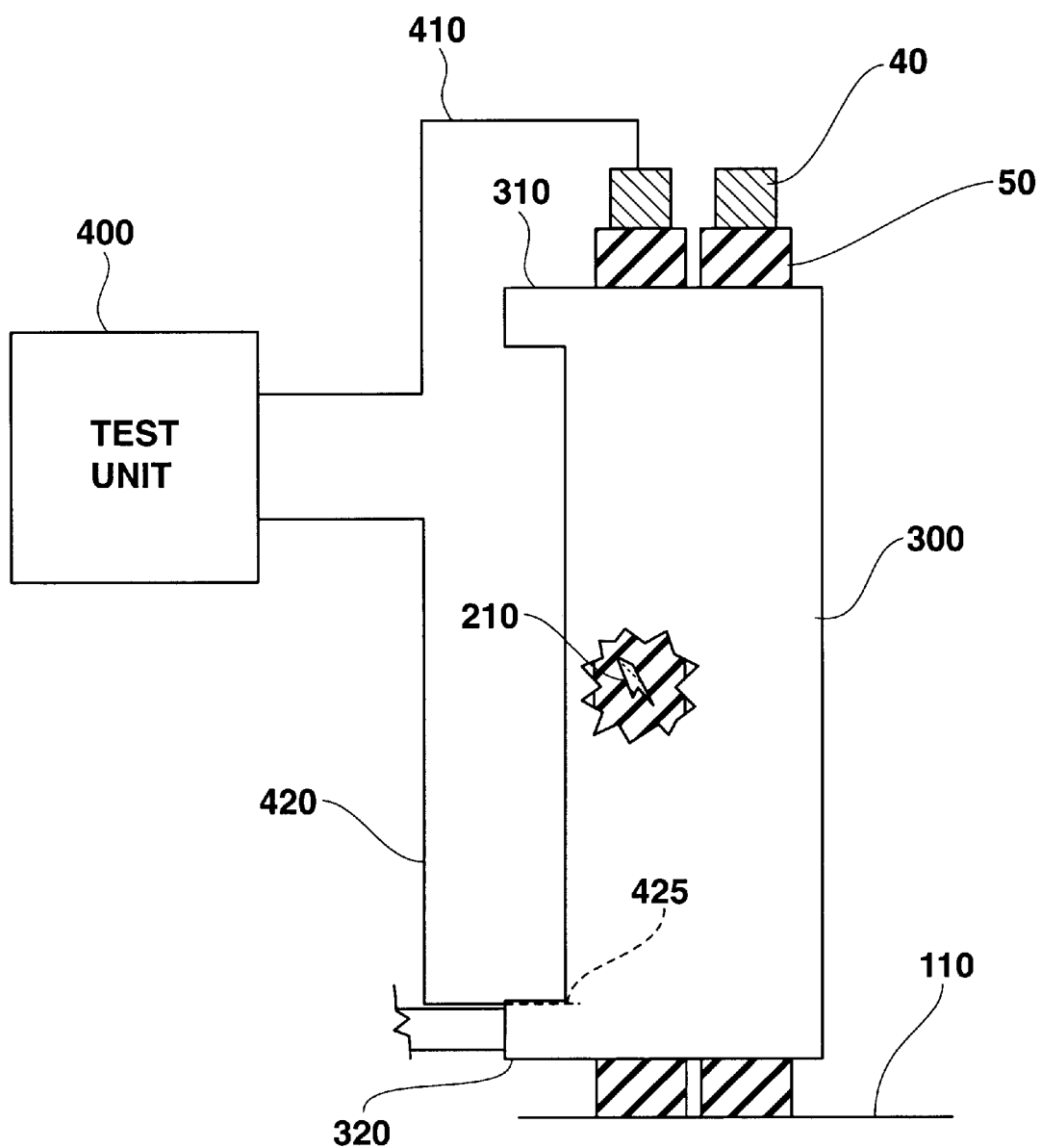
FIG. 12 shows a simplified schematic representation of how a wire is tested for degradation using the jacket, a test unit, and two test elements.

FIG. 12 is similar to FIG. 11, except that the container CM and the reservoir R have been removed to simplify the drawing, the degradation 210 in the insulation 50 of one of the wires is shown, and the test unit 400 also is shown. A first test element 410 is connected to test unit 400 and is electrically coupled to one of the conductors 40 of one of the wires. Here, "electrically coupled" means that there may be any number of intervening connectors and other connecting wires between the test element and the conductor, so long as there is an electrical path to the conductor. A second test element 420 is connected or coupled to test unit 400 and is electrically coupled through the evacuation port 320 to the conductive medium inside of the jacket 300. The second test element 420 has an end 425 that is contained within the jacket 300.

Referring now to FIGS. 6, 10, 11, and 12, the manner in which the high-degradation part 200 of the wire 30 is tested according to the invention will now be described. A jacket 300 is disposed around a substantial part of the high-degradation part 200 of the wire 30. The jacket ends 330 are made substantially watertight. A container CM of conductive medium is connected to introduction port 310. The end 425 of the second test element 420 is disposed inside the jacket 300 via the evacuation port 320. A reservoir R for receiving the conductive medium from the jacket 300 is connected to the evacuation port 320. Conductive medium from container CM is used to fill up the jacket 300. The conductive medium surrounds the part of the wire 30 disposed inside the jacket 300 (or, if a cable is being tested, the conductive medium surrounds the parts of all of the wires 30 disposed inside the jacket 300).

The second test element 420 is connected to test unit 400. The first test element 410 is electrically coupled to the conductor 40 of the wire 30. An attempt is made to induce a current within the wire 30. If the insulation 50 of a wire 30 being tested is degraded (i.e., has a degradation 210), then a current will flow from the test unit, through the first test element 410, through the conductor 40, through the degradation 210, through the conductive medium, to the end 425 of the second test element 420 and back to the test unit 400. On the other hand, if the insulation 50 of a wire 30 being tested is not degraded, no current will flow back to the test unit 400, owing to the prevention of such a current by the insulation 50 surrounding the conductor 40.

Figure 16:
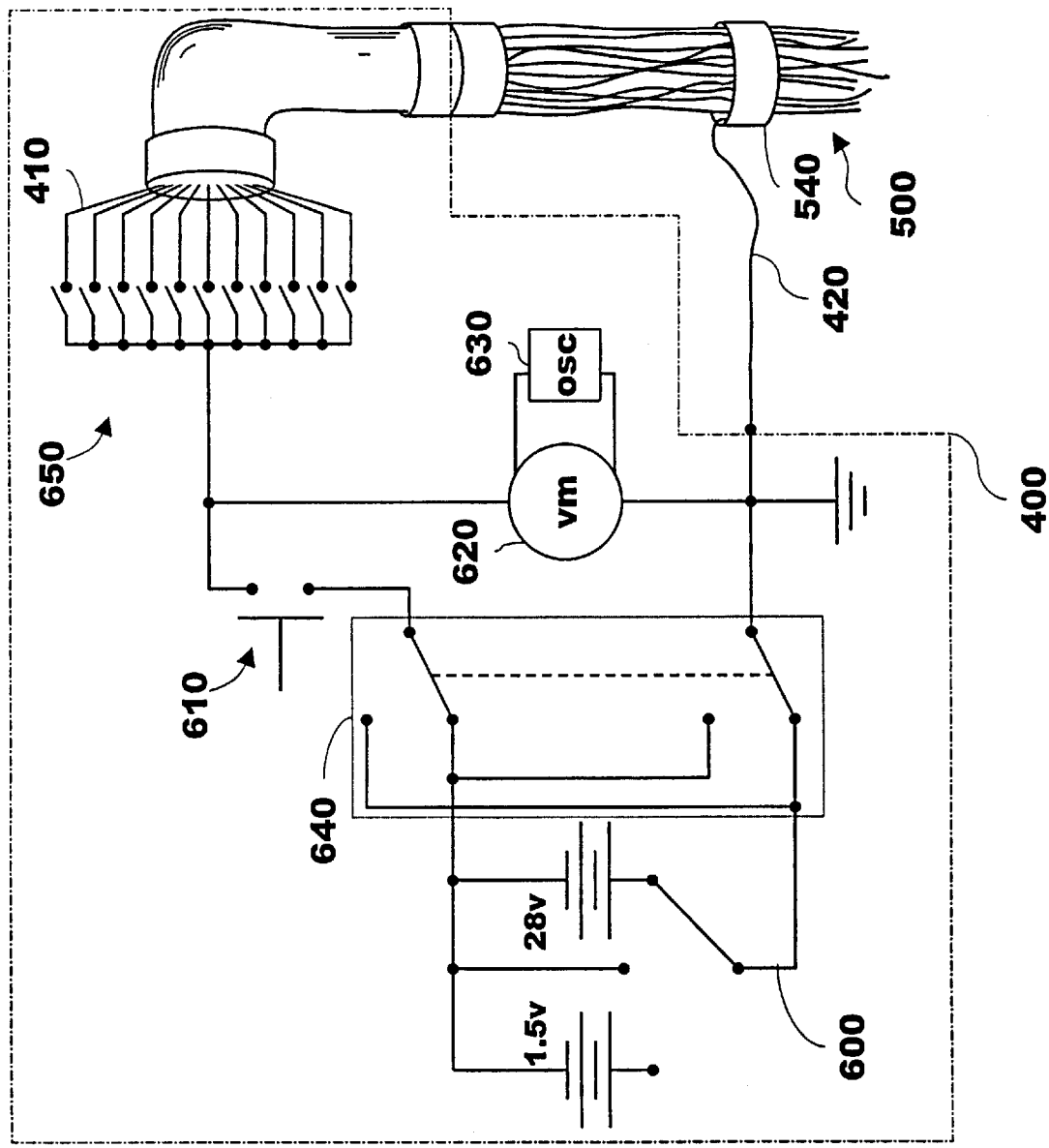
FIG. 16 shows one test circuit, referred to as circuit no. 1.
Figure 17:
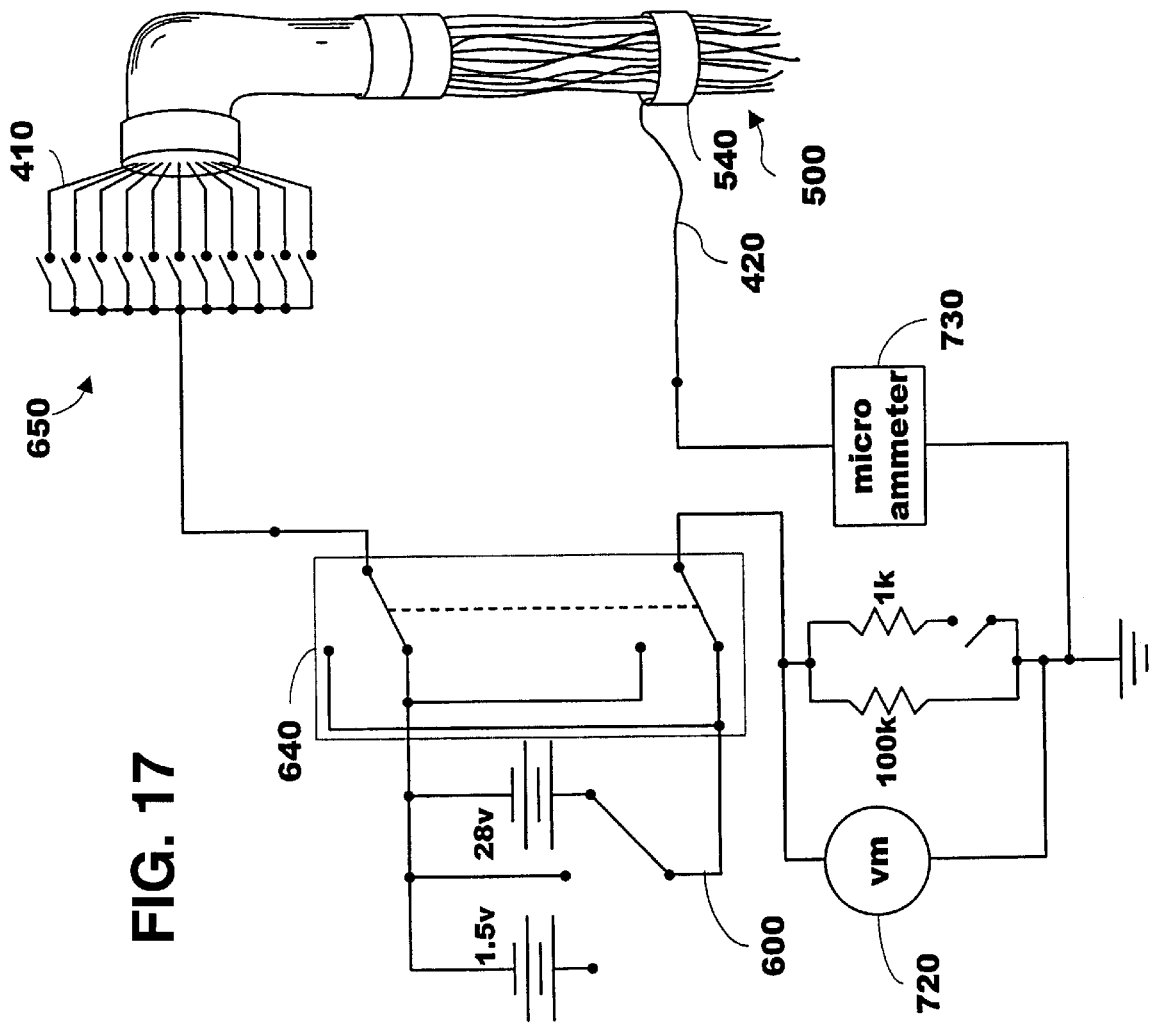
FIG. 17 shows another test circuit, referred to as circuit no. 2.
Figure 18:
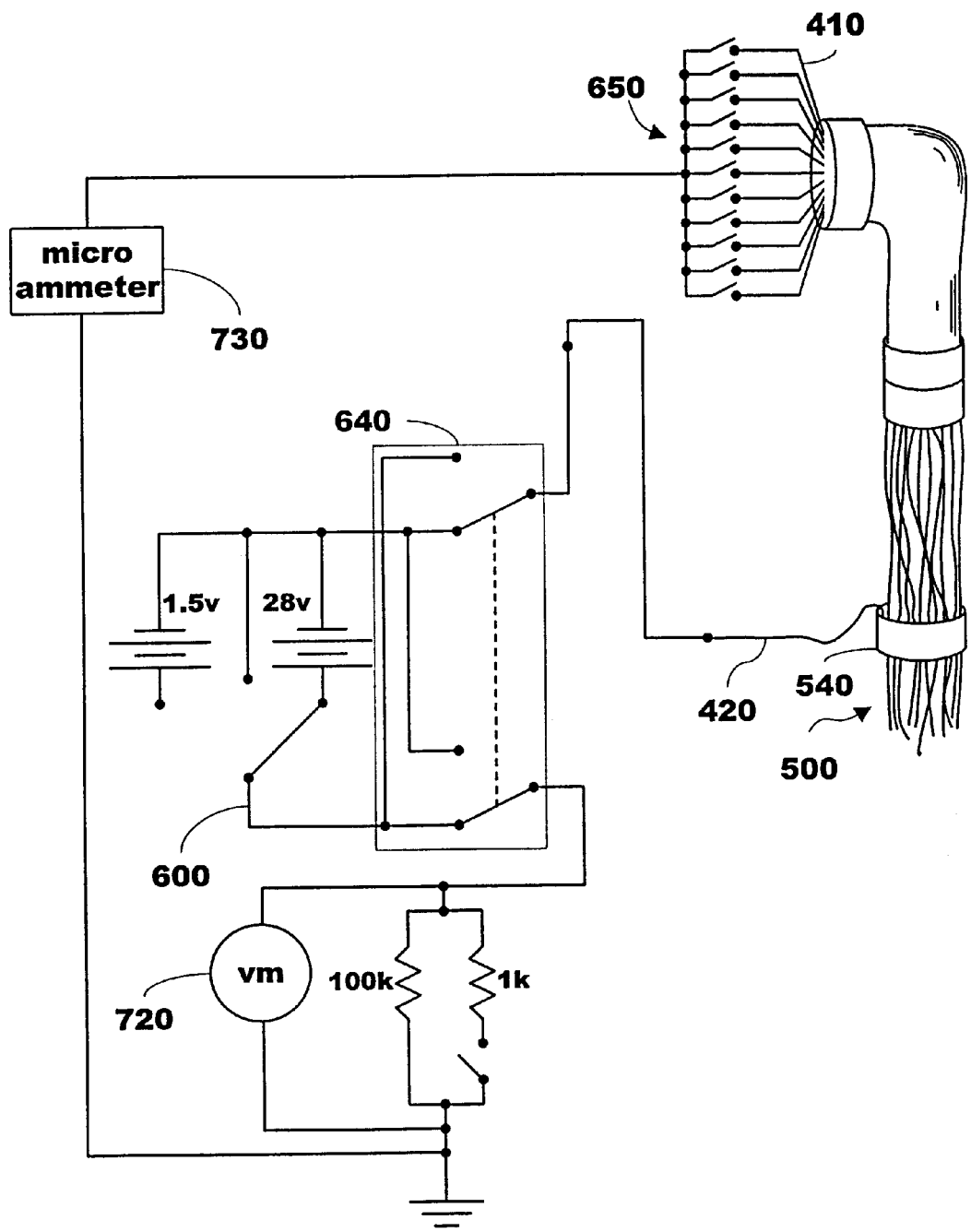
FIG. 18 shows yet another test circuit, referred to as circuit no. 3.

The test unit 400 may be provided with a receptor for receiving a cable connector (see FIGS. 16, 17, and 18, for example). For example, a socket to receive the cable 10 as shown in FIG. 2 may be included in the test unit. In such a case, the test unit will include a switch that selectively connects the first test element 410 with the pins 45 (and, ultimately, with each of the conductors 40 of the wires 30) of the cable 10. By way of such a receptor, the testing of each of the wires 30 of a cable 10 may be facilitated.

One of the challenges of testing wiring for degradation in situ is that it might be undesirable for the conductive medium to remain after the test is completed. Therefore, according to one embodiment of the invention, the conductive medium may be removed. For example, if the conductive medium is water, it may easily be removed from the jacket 300 to the reservoir R by vacuuming it out. The provision of the jacket 300 makes it possible to test the wires in the high-degradation part without getting conductive medium in the undesired areas of the surrounding environment. In the case of water, trace amounts of the conductive medium do not pose a problem because the water can evaporate. In the case of salt water, when the conductive medium dries, it leaves behind only a dry substance (namely, salt) that is substantially insulative in nature.

Figure 13:
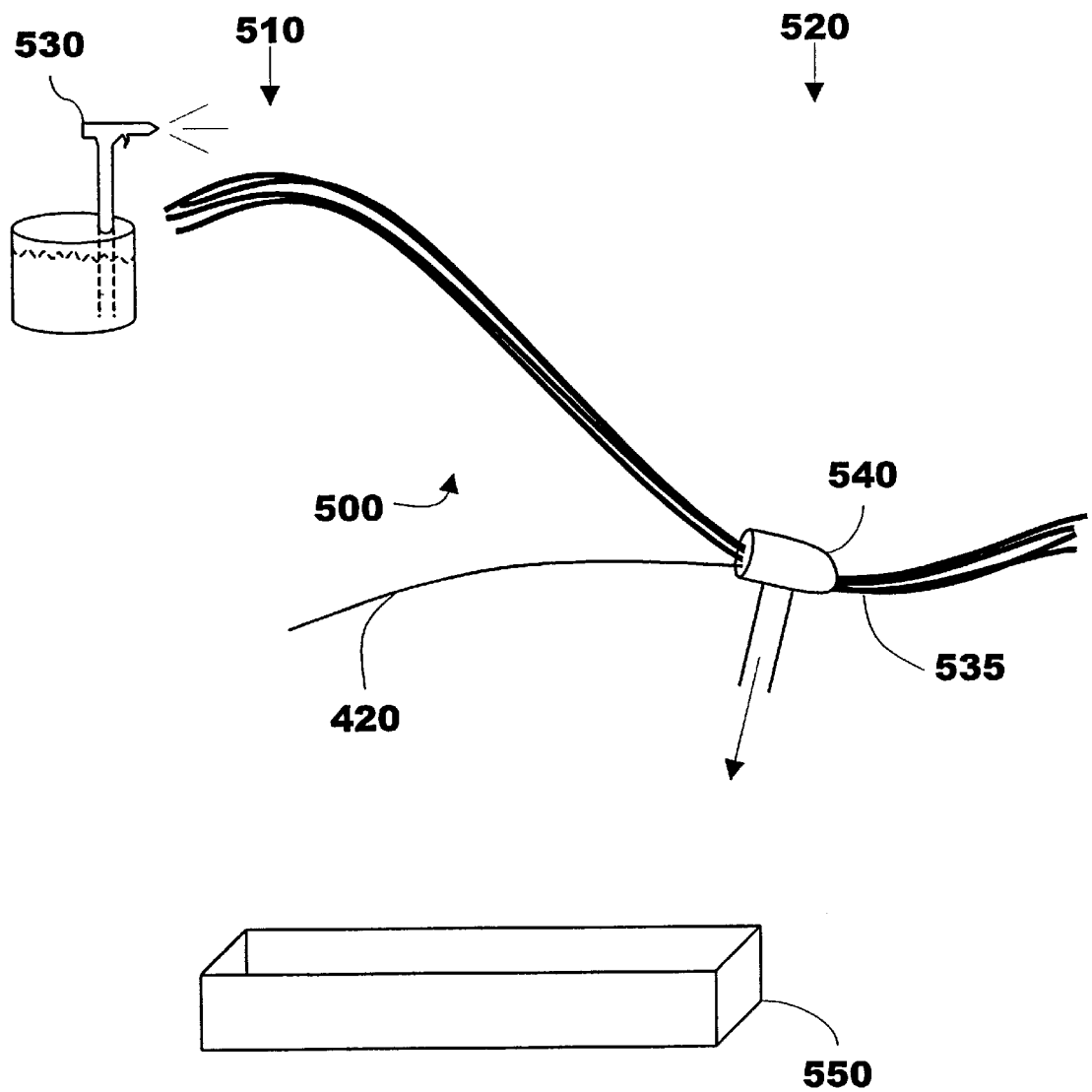
FIG. 13 shows how a wire may be tested for degradation without use of a jacket, and with the effective control of the conductive medium.

The foregoing discussion has focused on one embodiment of the invention in which a jacket is used. It is not always possible to use a jacket. FIG. 13 shows an example of a testing method according to the invention which does not use a jacket.

In FIG. 13, a bundle of wires 500 is to be tested. More particularly, only a portion of the bundle of wires 500 between the positions marked by reference numeral 510 and reference numeral 520 is to be tested. To effect the testing, a conductive medium is sprayed from a source 530 onto the bundle 500. Under the influence of gravity and capillary-like action of the interstices between the wires, the conductive medium flows to a low point of the wire indicated as reference numeral 535. At the low point 535 of the bundle of wires 500 there is provided a suction unit 540. Suction unit 540 may be a rubber boot or the like, and may optionally be tapered toward a suction hose. To catch any conductive medium that falls off of the bundle of wires 500 prior to reaching the suction unit 540, there may be provided a pan 550 or the like.

By spraying the conductive medium from source 530 constantly onto the bundle of wires 500, taking into account the rate at which the conductive medium flows down the bundle 500, the conductive medium is disposed around the wires in sufficient quantity so that testing may be undertaken. The first test element 410 (not shown in this Figure) is connected selectively to each conductor of the wire bundle 500 (or to all of them at once, optionally, as described further below). The second test element 420 may be disposed in various different locations, but is preferably placed near suction unit 540, as shown in FIG. 13, but not so close to the suction as to dry out the test element.

Figure 14:
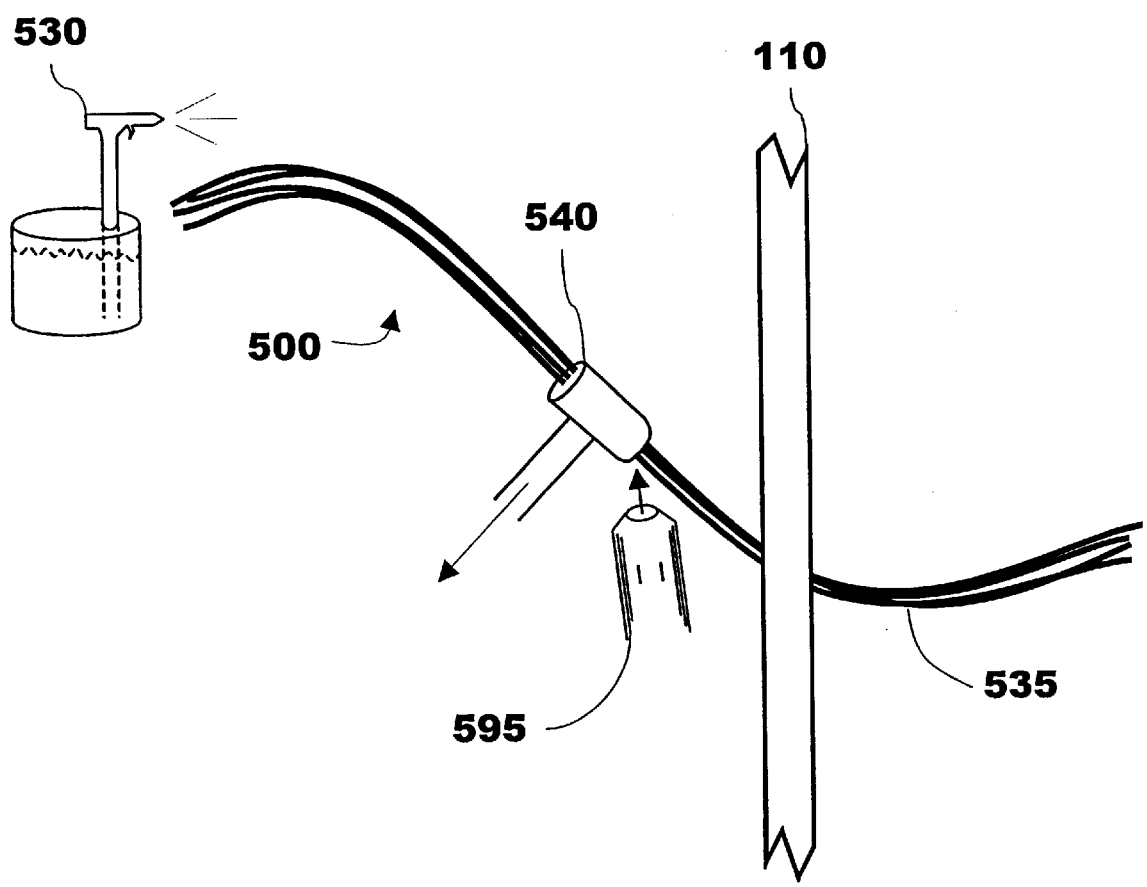
FIG. 14 shows how a wire may be tested for degradation without use of a jacket when the wire to be tested is in an awkward position.

FIG. 14 shows another example of a testing method according to the invention which does not use a jacket. FIG. 14 is similar to FIG. 13, except that it shows a close-up area near the suction unit 540 and also shows a barrier 110. The location of barrier 110 presents a particular problem because the low part 535 of the wire bundle is not disposed on the accessible side of the barrier. This is an awkward arrangement of the wires. In such a situation, testing according to the invention may still be implemented without causing damage to the environment around wire bundle 500. According to one embodiment of the invention, there is provided a source of high-pressure air 595. The source of high-pressure air 595 encourages, or urges, any of the conductive medium that is not extracted by the suction unit 540 back in the direction of that suction unit so that it can be removed. To put it another way, the high-pressure air source 595 is strong enough to create a barrier of air which prevents or at least substantially retards the progression of the conductive medium beyond the suction unit 540. A pan 550 may of course be provided under this area as necessary.

Now some details relating to the electrical aspects of testing the wires for degradation will be provided. In particular, there are three different testing circuits which are preferably used, depending upon the situation.

Figure 15:
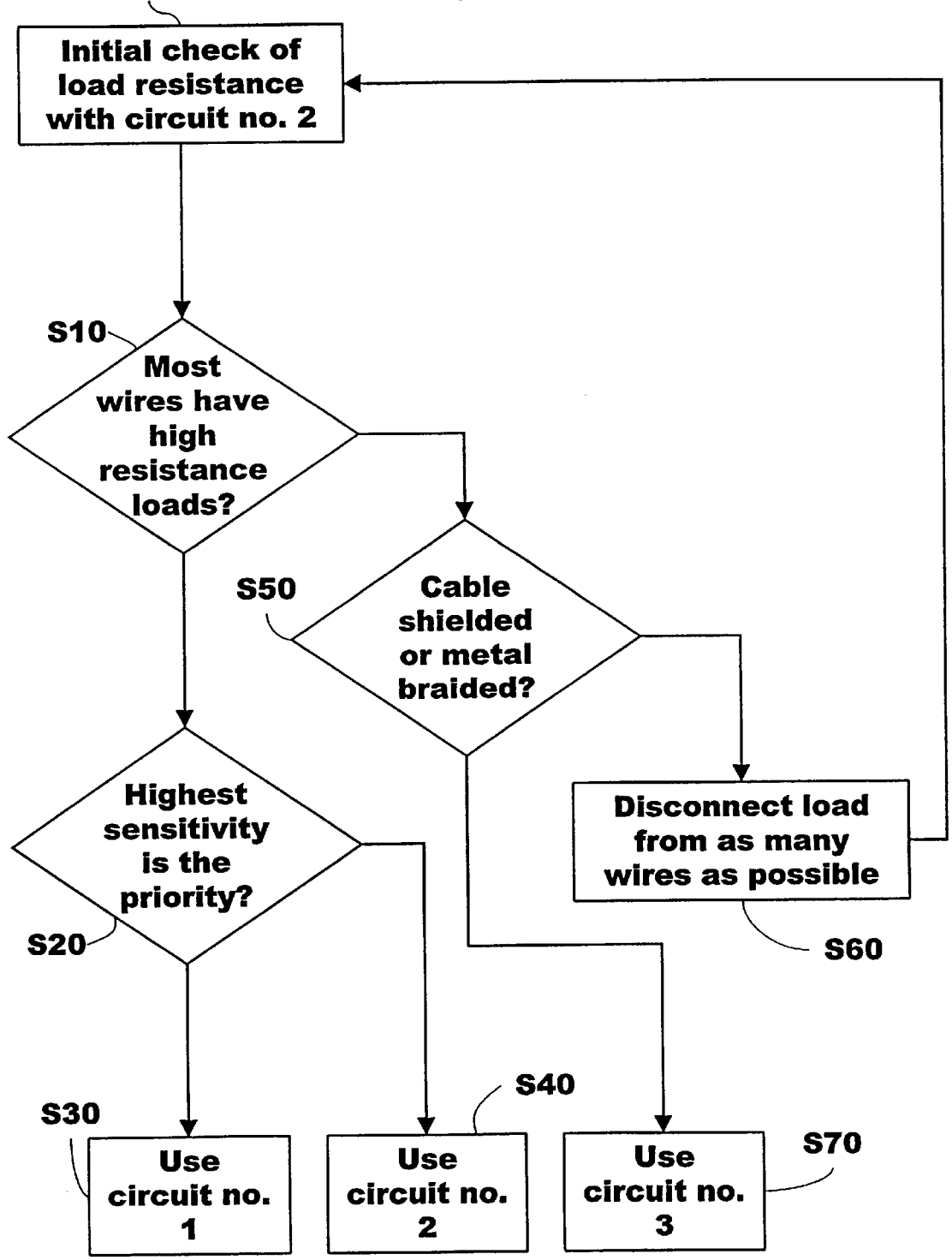
FIG. 15 shows a decision flow diagram relating to the selection of test circuits.

With reference to FIG. 15, there is shown a decision diagram that indicates which of the three different testing circuits is to be used. The circuits themselves will be described briefly below. In FIG. 15, an initial check of the load resistance is made using circuit No. 2 (see FIG. 17). From this initial check, it can be determined whether most of the wires being tested in the cable have high resistance loads. At step S10, a decision is made as to whether most of the wires do have high resistance loads.

When it is determined-in step S10 that most of the wires do have high resistance loads, a further decision is made in step S20. That decision, in step S20, is whether the highest sensitivity to degradation is a priority. If the highest sensitivity is an important priority in the present situation, then circuit No. 1 (see FIG. 16) is employed at step S30. If not, then circuit No. 2 (see FIG. 17) is employed at step S40.

Returning now to step S10, if most of the wires do not have high resistance loads, then a further decision is required at step S50. At step S50, an investigation is made as to whether the cables being tested include shielded or metal braided cables. If there are shielded or metal braided cables in the harness, then it may be necessary (see step S60) to disconnect the load from as many wires as possible, and start again from the initial check in step S00. If it is not the case that there are shielded or metal braided cables in the harness, then circuit No. 3 is used at step S70 (see FIG. 18).

A discussion of circuit No. 1 will now be given with reference to FIG. 16. Circuit No. 1 is the most sensitive of the three circuits, and can be used to find very fine cracks in the insulation. Circuit No. 1 can detect cracks that have a resistance of up to $10^{12}$ ohms. It compares the voltage decay of wires as they are with the voltage decay after a conductive medium has been applied to the wire. The impedance at the opposite end of the wire (i.e. the end of the wire that is not connected to the test unit 400) must be large. In particular, that impedance must be greater than $10^{12}$ ohms.

Circuit No. 1 includes a voltage selection switch 600, a momentary pushbutton test switch 610, a high impedance voltmeter 620 (high impedance being, for example, around $10^{17}$ ohms), an oscilloscope 630, and a voltage polarity switch 640. The voltage polarity switch 640 is operated as necessary to ensure the correct polarity for circuit No. 1 for testing circuits that have diodes. A switch box 650 is optionally provided so as to conveniently connect the different wires of the cable being tested to the circuit.

The voltage selection switch 600 has a position with no voltage. This position is discussed later with respect to circuit No. 2.

First, the voltage selection switch 600 is set to 1.5 volts and the momentary pushbutton test switch 610 is closed. The test switch 610 is released, and the voltage decay measured by the high impedance voltmeter 620 is monitored using the oscilloscope 630. There should not be much decay for at least one minute after releasing the test switch 610. The test switch is then re-closed and the conductive medium is applied. Then, the test switch 610 is opened and the voltage decay is noted. If the decay is approximately the same as before, then there is no breach in the insulation under test. If the decay is rapid, however, (i.e., less than one second) then there is a breach in the insulation. In circuit No. 1, rapid decay indicates an insulation breach.

It will be noted that, in circuit No. 1, the switch box 650 is capable of connecting all of the different wires of the cable being tested to the circuit at the same time. Likewise, each wire may individually be switched on or off. In a preferred embodiment of the invention, all of the wires are tested at once for the above-identified rapid decay. If a rapid decay is detected, this indicates that at least one of the wires under test has an insulation breach, and then each wire is individually tested to determine which one has the breach.

The sensitivity of circuit No. 1 is limited by the load impedance (i.e. impedance at the end of the wire that is not connected to the test unit 400). For the test to successfully detect a crack, the change in the decay time after the conductive medium is applied must be easily observed. Without more sophisticated equipment than discussed here, this means that the resistance of a detectable crack is limited to about a factor of 10 lower than the load impedance. For example, if the load impedance was $10^{12}$ ohms, a crack with resistance of up to $10^{11}$ ohms could be detected. If the load impedance was $10^7$ ohms, a crack with resistance of up to about $10^6$ ohms could be detected.

As a practical matter, however, if the resistance of the crack is too high the measurement time needed to detect a change in the decay time may become too long. For typical values of wire capacitance found on aircraft ($10^{-10}$ to $10^{-9}$ Farads), the decay time for a crack of $10^{11}$ ohms is 10 to 100 seconds.

Unless test time is not an issue, this will limit the useful sensitivity of circuit No. 1 to detection of a crack with $10^{11}$ ohms or less, regardless of the load resistance.

It should be noted, for clarity, that, in the foregoing discussion, a value given for the resistance of a crack assumes the crack has been treated with the conducting medium and is not dry. The resistance of a typical dry crack may be as high as 10^20 ohms.

Circuit No. 2 includes several features that are substantially the same as circuit No. 1, and these are indicated by like reference numerals. In addition, circuit No. 2 includes a voltmeter 720 and a micro-ammeter 730. The position of the voltage selector circuit 600 for which no voltage is used is a position useful for detecting background currents so that they can be distinguished from the test currents to be described below.

Circuit No. 2 is the most used circuit. It requires the load at the opposite end of the wire to be only 10 Mohms or greater. It is sensitive enough to find almost any cracks that have reached through to the conductor. It compares the current in the wire under test without the conductive medium applied, with the current after the conductive medium is applied. If an insulation breach exists, the later current will increase significantly. As with each of the circuits, care must be taken to insure that the conducting medium does not get into undesirable locations. As will become apparent, this circuit may be more convenient to use than No. 1. Circuit No. 1 requires the observation of a test signal for a decay, but circuit No. 2 involves just the comparison between two different currents. Also, the load at the end of the wire does not have to be to great for the circuit No. 2 as was the case with circuit No. 1.

Circuit No. 2 has a 100k and a 1k resistor in parallel with the voltmeter. These resistors are used to measure the current coming from the battery. When the switch in series with the 1k resistor is closed, the equivalent resistance is 1k (1 microAmp per millivolt measured on the voltmeter). When the switch is open, the equivalent resistance is 100k (0.01 microAmp per millivolt measured on the voltmeter). Thus, the switch in series with the 1k resistor is for selecting the sensitivity of the battery current measurement circuit.

When using circuit No. 2, the voltage selection switch 600 is set to 28 volts or 1.5 volts depending on the delicacy of the load circuits of the wires under test. The current is noted. Then, the conducting medium is applied and any increase in the current is noted. If a jump in the current is detected, this indicates an insulation breach. Subsequently, the conductive medium can be reapplied to verify and to pinpoint the location of the insulation breach.

With circuit No. 2, as was the case with circuit No. 1, it is advantageous to initially connect all the wires to the test switch. If the above-identified jump in current is detected, an insulation breach is present. To isolate the individual wire which has the breach, the individual wire switches of the switch box 650 are turned off one by one until the current goes away. The wire thus detected may then be further investigated.

A description of circuit No. 3 will now be given with reference to FIG. 18. The individual components of circuit No. 3 are substantially the same as circuit No. 2, but the arrangement is different. Circuit No. 3 can be used when there is a low impedance load on the wires to be tested and it is impractical to remove the load. It is a great advantage not to need to consider the wire loads. A disadvantage of the circuit is that hidden current leakage paths to an airframe, to clamps, to wire shields, and the like, will give false positive readings. Therefore, circuit No. 3 can be used to prove that there are no insulation breaches; an indication of a wire breach, however, should be verified using another method. As already mentioned, circuit No. 3 is similar to circuit No. 2, but in circuit No. 3 the test voltage is applied to the second test element 420 and leakage current is measured through the first test element 410 and the switch box 650.

When using circuit No. 3, the voltage selection switch 600 is set to 28 volts or 1.5 volts depending on the delicacy of the load circuits of the wires under test. The current is noted. The conductive medium is then applied to the wire or wires under test, and any increase in the current is noted. If a jump in current is found, this indicates an insulation breach. The wire with the breach is found by turning off individual ones of the wire switches on the switch box, one by one, until the current goes away. Once a wire is isolated, the conductive medium can be reapplied to verify and to pinpoint the location of the insulation breach.

The invention has thus been described with respect to various preferred embodiments, in which many specificities have been given and in which several specific diagrams and drawings have been provided. The invention, however, is not meant to be limited to this single embodiment, or to just the circuits diagrammed in detail, but is to be interpreted in the light of the appended claims.

We claim:

1. A method of testing, in situ in an aircraft, a part of a wire for degradation, said wire including a conductor and insulation, said method comprising:
   a. disposing a conductive medium on said part of said wire in situ;
   b. providing a first test element in contact with said conductor of said wire;
   c. providing a second test element in contact with said conductive medium;
   d. testing said wire by applying a voltage to said first test element; and
   e. when said testing creates a current detectable at one of said first test element and said second test element, determining said insulation to be degraded;
   wherein said wire remains rigidly installed in situ in said aircraft during said steps a–e.

2. The method of testing a part of a wire as set forth in claim 1, wherein said conductive medium comprises water.

3. The method of testing a part of a wire as set forth in claim 1, further comprising:
   enclosing said part of said wire in a jacket; and
   performing said disposing step by introducing into said jacket said conductive medium.

4. The method of testing a part of a wire as set forth in claim 1, further comprising removing said conductive medium from said wire.

5. The method of testing part of a wire as set forth in claim 4, wherein said step of removing said conductive medium comprises vacuuming said conductive medium.

6. The method of testing part of a wire as set forth in claim 5, further comprising a step of directing pressurized air toward said conductive medium.

7. The method of testing part of a wire as set forth in claim 1, wherein said conductive medium comprises a substance conductive in a liquid form and substantially non-conductive in a solid form.

8. The method of testing part of a wire as set forth in claim 7, wherein said substance is salt.

9. The apparatus for testing a part of a wire as set forth in any one of claims 13–15, further comprising a jacket holding said conductive medium on said part of said wire.

10. The apparatus for testing a part of a wire as set forth in claim 9, further comprising means for removing said conductive medium from said jacket.

11. The apparatus for testing a part of a wire as set forth in any one of claims 13–15, further comprising said conductive medium being water.

12. The apparatus for testing a part of a wire as set forth in any one of claims 13–15, wherein said test unit comprises:
   a voltage source, a cable receptor, and a selector;
   said cable receptor being adapted to receive a cable connector of a cable that includes said wire and other wires, said wire and said other wires defining a plurality of wires of said cable;
   said cable receptor including a plurality of elements, each of said elements being disposed so as to be electrically coupled with a corresponding one of said plurality of wires when said cable connector is disposed in said cable receptor; and
   said selector switch electrically coupling said voltage source to a selected one of said elements of said cable receptor.

13. An apparatus for testing, in situ, a part of a wire for degradation, said wire including a conductor and insulation, said apparatus comprising:
   a first test element in contact with said conductor of said wire in situ;
   a second test element in contact with a conductive medium on said part of said wire in situ; and
   a test unit electrically coupled with said first test element and said second test element;
   wherein said test unit tests said part of said wire for degradation by detecting a current flowing along a path including said first test element, said conductive medium, and said second test element; and
   wherein said test unit has a test circuit comprising:
      a voltmeter connected across said first test element and said second test element;
      a polarity switch connected in parallel with said voltmeter;
      a momentary connection switch; and
      a voltage selection circuit connected in parallel with said polarity switch.

14. An apparatus for testing, in situ, a part of a wire for degradation, said wire including a conductor and insulation, said apparatus comprising:
   a first test element in contact with said conductor of said wire in situ;
   a second test element in contact with a conductive medium on said part of said wire in situ; and
   a test unit electrically coupled with said first test element and said second test element;
   wherein said test unit tests said part of said wire for degradation by detecting a current flowing along a path including said first test element, said conductive medium, and said second test element; and
   wherein said test unit has a test circuit comprising:
      a voltage selector circuit in parallel with a polarity switch, said voltage selector circuit having a terminal providing no voltage;
      said polarity switch being connected between said first test element and a voltmeter;
      a sensitivity selection circuit in parallel with said voltmeter; and
      an ammeter connected between said voltmeter and said second test element.

15. An apparatus for testing, in situ, a part of a wire for degradation, said wire including a conductor and insulation, said apparatus comprising:
   a first test element in contact with said conductor of said wire in situ;
   a second test element in contact with a conductive medium on said part of said wire in situ; and
   a test unit electrically coupled with said first test element and said second test element;
   wherein said test unit tests said part of said wire for degradation by detecting a current flowing along a path including said first test element, said conductive medium, and said second test element; and
   wherein said test unit has a test circuit comprising:
      a voltage selector circuit in parallel with a polarity switch, said voltage selector circuit having a terminal providing no voltage;

said polarity switch being connected between said second test element and a voltmeter;

a sensitivity selection circuit in parallel with said voltmeter; and an ammeter connected between said voltmeter and said first test element.

* * * * *